(12) United States Patent
Chen et al.

(10) Patent No.: US 7,974,100 B2
(45) Date of Patent: Jul. 5, 2011

(54) RETAINING DEVICE FOR PCI CARD

(75) Inventors: Yun-Lung Chen, Taipei-Hsien (TW);
Da-Long Sun, Shenzhen (CN);
Wan-Cheng Lin, Taipei Hsien (TW);
Pei-Bin Luo, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 705 days.

(21) Appl. No.: 11/967,071

(22) Filed: Dec. 29, 2007

(65) Prior Publication Data
US 2009/0154119 A1 Jun. 18, 2009

(30) Foreign Application Priority Data

Dec. 12, 2007 (CN) ...................... 2007 2 0201614 U

(51) Int. Cl.
*H05K 7/00* (2006.01)
(52) U.S. Cl. ........ 361/747; 361/801; 361/802; 361/759; 361/752

(58) Field of Classification Search .................. 361/801, 361/747, 802, 759, 752
See application file for complete search history.

(56) References Cited

U.S. PATENT DOCUMENTS

| | | | | |
|---|---|---|---|---|
| 5,982,627 A * | 11/1999 | Haughton et al. | ............ | 361/759 |
| 6,320,760 B1 * | 11/2001 | Flamm et al. | ................. | 361/801 |
| 7,471,507 B2 * | 12/2008 | Huang | ..................... | 361/679.55 |
| 7,561,440 B2 * | 7/2009 | Dai | ................................ | 361/801 |
| 2006/0120030 A1 * | 6/2006 | Huang | .......................... | 361/683 |

* cited by examiner

*Primary Examiner* — Yuriy Semenenko
*Assistant Examiner* — Andargie M Aychillhum
(74) *Attorney, Agent, or Firm* — Frank R. Niranjan

(57) ABSTRACT

A retaining device for a PCI card (30) includes a chassis (50), a retaining plate (20) configured for retaining the PCI card, and a mounting apparatus (10). The chassis has a rear wall (52). The rear wall has two clipping portions (526) and a perpendicular portion (52). The retaining plate includes an end (22) abutting on the perpendicular portion of the rear wall of the chassis. The mounting apparatus includes a mounting strip (11), and a mounting bracket (13) resisting on the end of the retaining plate. The mounting strip includes an elongated main body (12) with a handling portion (127) formed in the middle thereof and two arms (15) extending from two ends of the main body for engaging with the clipping portions respectively. The mounting strip abuts on the mounting bracket.

15 Claims, 5 Drawing Sheets

RETAINING DEVICE FOR PCI CARD

BACKGROUND

1. Field of the Invention

The present invention relates to retaining devices, more particularly to a retaining device for a PCI card.

2. Description of Related Art

Peripheral component interconnect (PCI) cards are widely used in computers. PCI is a kind of bus structure, which is used for connecting to modem cards, monitor cards, sound cards or other peripheral equipment. The common fixing manner for PCI cards usually involves screws. Such a manner not only requires screws but also a screwdriver, which is time-consuming and troublesome, and the screws are easily lost. Moreover, if a screw falls into the PCB and is not noticed, damage may occur when the computer is powered up. Furthermore, with the development of computers, more and more components are needed to be installed in the computer. The space in the computer enclosure will be occupied by a mass of electronic components so that not enough space for operating a screwdriver will exist.

What is needed, therefore, is a retaining device for simply securing PCI cards in a compact computer enclosure.

SUMMARY

A retaining device for a PCI card includes a chassis, a retaining plate configured for retaining the PCI card, and a mounting apparatus. The chassis has a rear wall. The rear wall has two clipping portions and an perpendicular portion. The retaining plate includes an end abutting on the perpendicular portion of the rear wall of the chassis. The mounting apparatus includes a mounting strip, and a mounting bracket resisting against the end of the retaining plate. The mounting strip includes an elongated main body with a handling portion formed in the middle thereof and two arms extending from two ends of the main body for engaging with the clipping portions respectively. The mounting strip abuts on the mounting bracket.

Other advantages and novel features of the present invention will become more apparent from the following detailed description of preferred embodiment when taken in conjunction with the accompanying drawings, in which:

DETAILED DESCRIPTION OF THE EMBODIMENT

Figure 1:
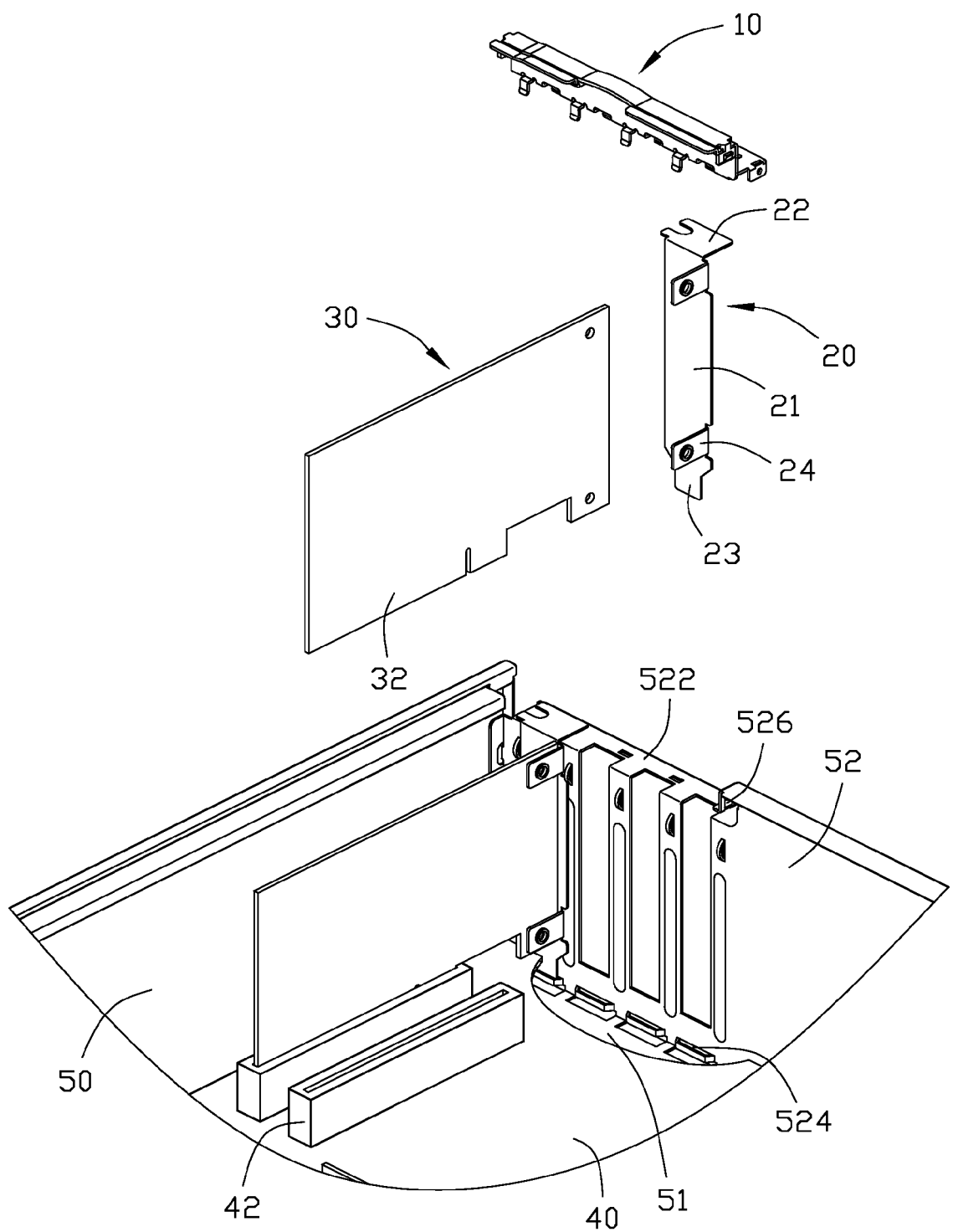
FIG. 1 is an exploded, isometric view of a retaining device for a PCI card in accordance with a preferred embodiment, including a chassis, a retaining plate for fastening a PCI card, and a mounting apparatus.

Referring to FIG. 1, a retaining device for PCI cards in accordance with a preferred embodiment of the present invention includes a mounting apparatus 10, a chassis 50, and a retaining plate 20 for fastening a PCI card 30. The PCI card 30 is rectangular with a connecting portion 32 protruding from one side thereof.

The retaining plate 20 is substantially L-shaped, including an elongated base 21, a blocking tab 22 perpendicularly extending from an end of the elongated base 21, and an inserting terminal 23 extending from the other end of the elongated base 21. Two securing tabs 24 perpendicularly extend from a same edge of the elongated base 21, in a same direction, for securing the PCI card 30.

Figure 3:
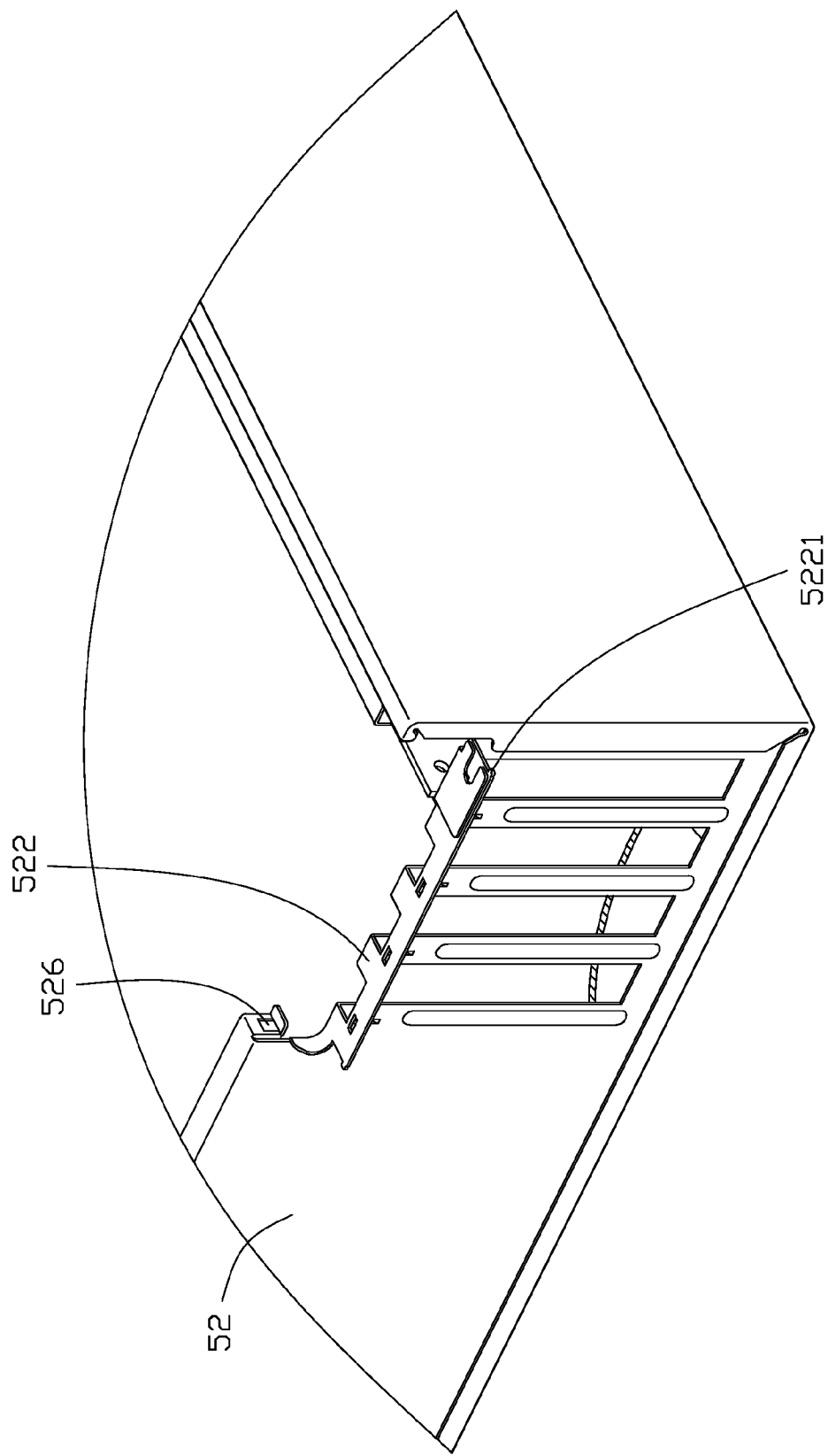
FIG. 3 is an enlarged view of the chassis in FIG. 1, but viewed from another aspect.
Figure 4:
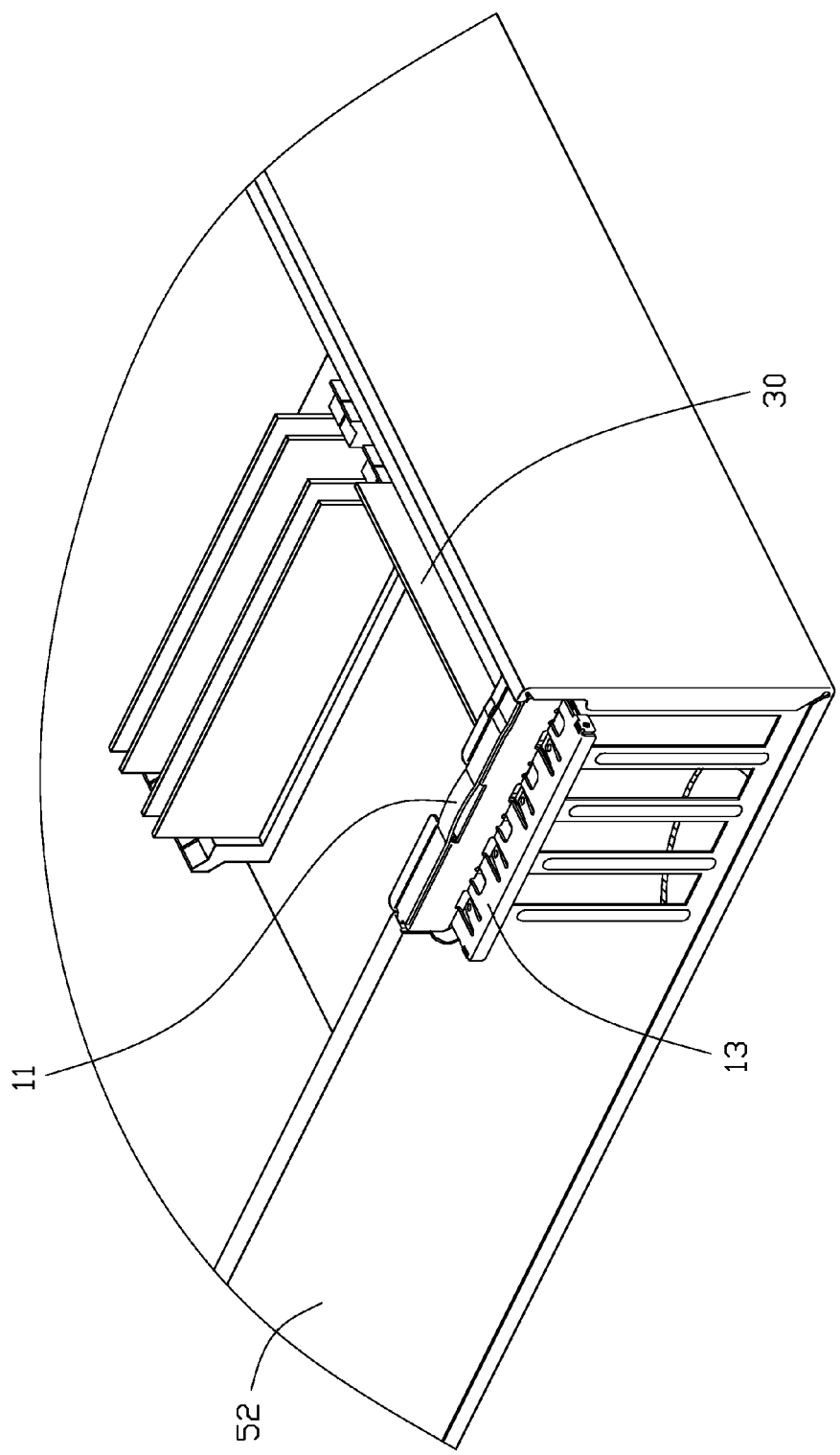
FIG. 4 is an assembled view of FIG. 1.

Referring to FIGS. 1 and 3, the chassis 50 includes a bottom wall 51 and a rear wall 52 perpendicularly extending from the bottom wall 51. A motherboard 40 is mounted on the bottom wall 51. The motherboard 40 includes a plurality of slots 42 for receiving the connecting portion 32 of the PCI card 30. The rear wall 52 defines an perpendicular portion 522. A plurality of positioning slots 524 is formed on an inner surface of the rear wall 51 and below the perpendicular portion 522. A pair of pivots 5221 protrudes from opposite ends of a distal edge of the perpendicular portion 522 respectively. A pair of clipping portions 526 defines in the rear wall 52.

Figure 2:
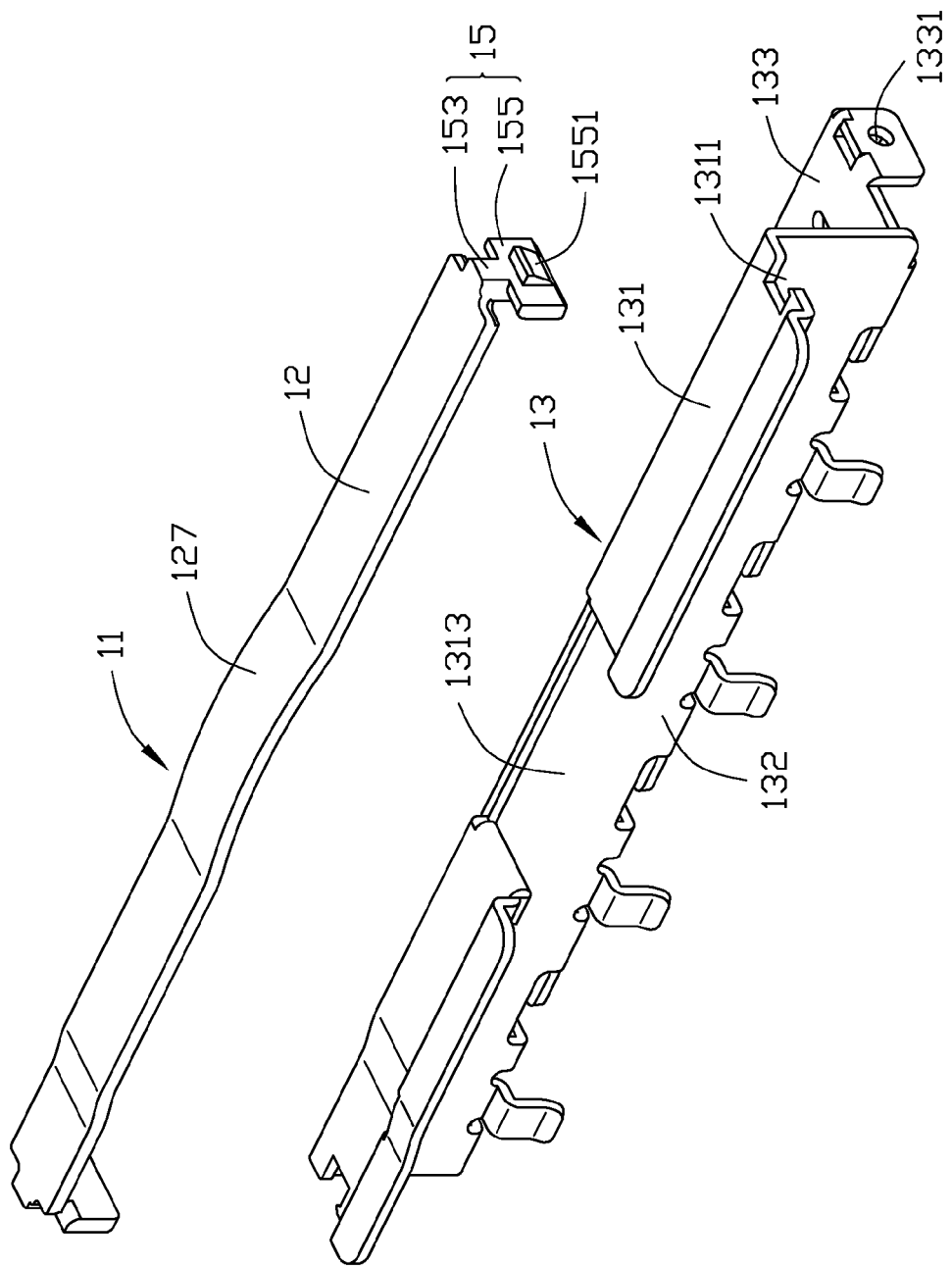
FIG. 2 is an exploded, enlarged view of the mounting apparatus in FIG. 1.

Referring to FIG. 2, the mounting apparatus 10 includes a resilient mounting strip 11 and a mounting bracket 13. The mounting strip 11 includes an elongated main body 12 and a pair of arms 15 extends from two ends of the main body 12. Each of the clipping portions 15 includes a smaller portion 153 extending from the main body 12 and a larger portion 155 extending from the smaller portion 153. A protrusion 1551 extends from the larger portion 155 for engaging with the clipping portion 526 of the rear wall 52. A handling portion 127 is bent to extend from the middle of the main body 12 of the mounting strip 11. The mounting bracket 13 comprises an upper plate 131 with a cutout 1313 in the middle portion thereof corresponding to the handling portion 127 of the mounting strip 11, a connecting plate 132 extending downward from one side of the upper plate 131, and a lower plate 133 extending horizontally from a lower side of the connecting plate 132. A pair of pivoting holes 1331 is defined in the lower plate 133 at two ends thereof respectively. A pair of cutouts 1311 is defined in the upper plate 131 at two sides thereof respectively. The width of the cutout 1311 is less than that of the larger portion 135 of the clipping portion 13, but more than that of the smaller portion 133 of the clipping portion 13.

Referring also to FIGS. 1 and 2, in assembly of the mounting apparatus 10, one smaller portion 153 of one of the arms 15 of the mounting strip 11 is firstly placed in one cutout 1311 of the mounting bracket 13. The handling portion 127 of the mounting strip 11 is deformed to elongate the main body 12 of the mounting strip 11 to enable the other smaller portion 153 to be placed in the other cutout 1311 of the mounting bracket 13. When the handling portion 127 is released, it rebounds to cause the two smaller portions 153 to be totally received in the cutouts 1311 of the mounting bracket 13 respectively, and the main body 12 and the larger portions 155 of the arms 15 resist against upper and bottom surfaces of the upper plate 131 respectively, adjacent the edges of the cutouts 1311. Thus, the mounting apparatus 10 is assembled.

Referring to FIGS. 1 to 4, in assembly, the retaining plate 20 with the PCI card 30 mounted thereon is placed on the rear wall 52 of the chassis 50. The inserting terminal 23 of the elongated portion 21 of each retaining plate 20 is inserted in the corresponding slot 524 of the rear wall 52 of the chassis 50. The blocking tab 22 of the retaining plate 20 is located on the perpendicular portion 522 of the rear wall 52 of the chassis 50. The connecting portion 32 of the PCI card 30 is respectively coupled to the corresponding ports 42 on the motherboard 40. The pivots 5221 of the perpendicular portion 522 of the rear wall 52 are respectively inserted into the pivoting holes 1331 of the mounting bracket 13 of the assembled mounting apparatus 10 to rotatably mount the mounting bracket 13 on the rear wall 52 of the chassis 50. Then the assembled mounting apparatus 10 is rotated towards the retaining plate 20. The protrusions 1551 of the arms 15 contact the rear wall 52 respectively. The arms 15 are deformed towards the middle of the mounting strip 11. The mounting apparatus 10 rotates until the protrusions 1551 are respectively aligned with the clipping portions 526. The arms 15 are released, and the protrusions 1551 are inserted respectively into the clipping portions 526 of the rear wall 52 of the chassis 50 to firmly secure the mounting apparatus 10 on the rear wall 52. At this time, the lower plate 133 of the mounting bracket 13 of the mounting apparatus 10 presses the blocking tabs 22 of the retaining plates 20, thereby enabling the blocking tabs 22 of the retaining plate 20 to be tightly sandwiched between the latch member 50 and the perpendicular portion 522 of the rear wall 52 of the chassis 50. Thus, the retaining plates 60 with the PCI cards 70 are mounted on the chassis 10.

Figure 5:
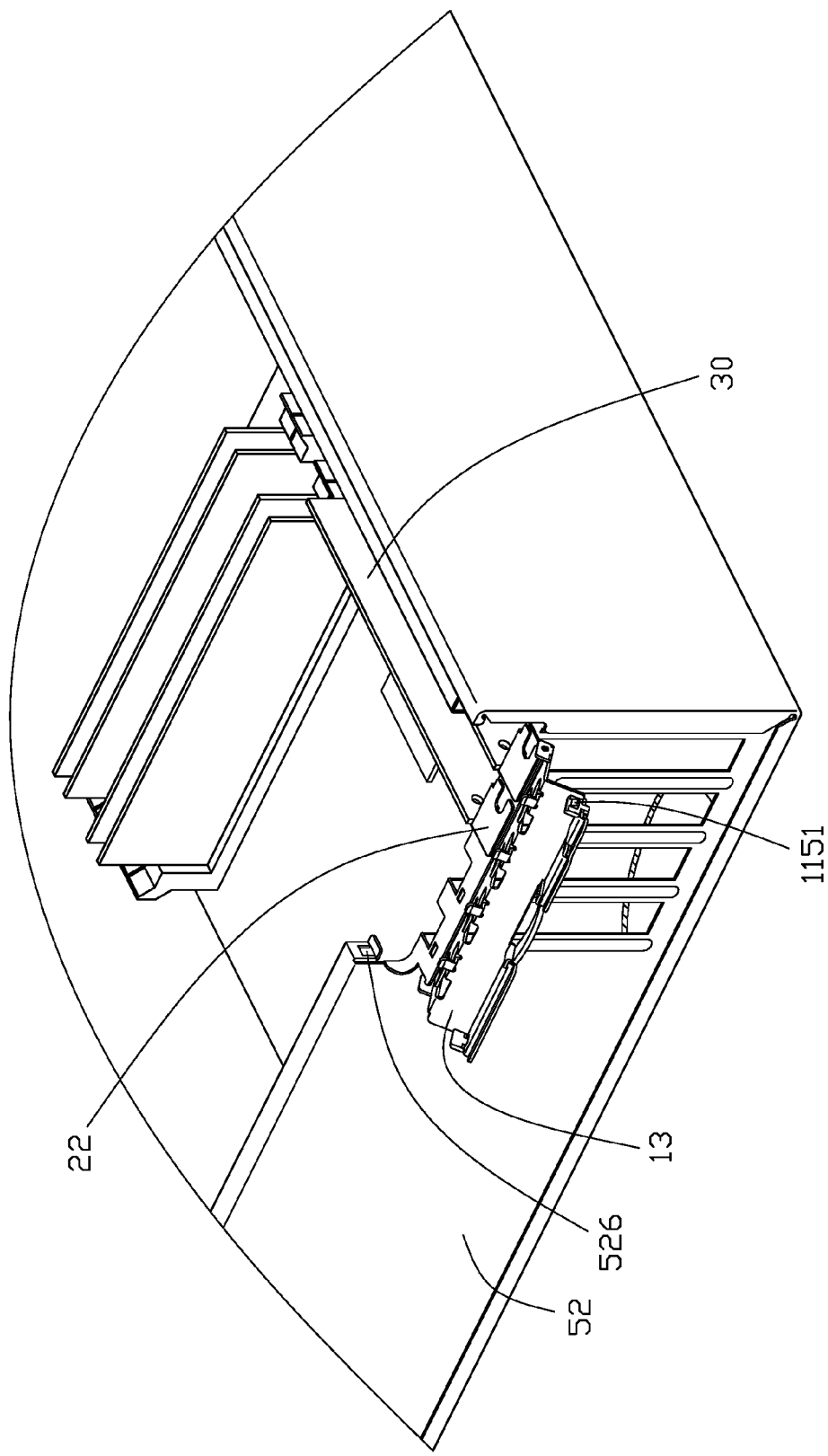
FIG. 5 is a pre-disassembled view of FIG. 4.

Referring to FIGS. 1, 2, and 5, in disassembly, the handle portion 127 of the mounting apparatus 10 is pulled outward to shorten the mounting strip 11. The clipping portions 155 at opposite ends of the handling portion 127 move towards the middle of the mounting strip 11, thereby enabling the protrusions 1551 of arms 15 to be released from the clipping portions 526 of the rear wall 52 respectively. Then the mounting bracket 13 is pivoted away from the blocking tab 22 to enable the lower plate 133 of the mounting bracket 13 far away from the blocking tab 22 of the retaining plates 20. Thus, the blocking tab 22 of the retaining plates 20 is released, and the retaining plates 20 with the PCI cards 70 can be disassembled from the chassis 10.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A retaining device for a PCI card, comprising:
 a chassis having a rear wall, the rear wall having two clipping portions and a perpendicular portion;
 a retaining plate configured for retaining the PCI card, the retaining plate comprising an end abutting on the perpendicular portion of the rear wall of the chassis; and
 a mounting apparatus comprising a mounting strip, and a mounting bracket resisting against the end of the retaining plate, the mounting strip comprising an elongated main body with a handling portion formed in the middle thereof and two arms extending from two ends of the main body, the two arms engaging with the clipping portions respectively to press the mounting bracket to resist the end of the retaining plate, the mounting strip abutting on the mounting bracket.

2. The retaining device as described in claim 1, wherein the mounting bracket comprises an upper plate with two cutouts at two ends thereof for receiving the arms of the mounting strip.

3. The retaining device as described in claim 1, wherein a width of the larger portion of the arm is larger than that of the cutout of the mounting bracket, and the main body of the mounting strip and the larger portions of the arms are arranged on two opposite sides of the upper plate of the mounting bracket.

4. The retaining device as described in claim 1, wherein the mounting strip abuts on one side of the mounting bracket, the other side of the mounting bracket rotatably mounted on the rear wall of the chassis.

5. The retaining device as described in claim 4, wherein the mounting bracket comprises a connecting plate extending downward from one side of the upper plate, and a lower plate extending horizontally from the connecting plate, the mounting strip abutting on the upper plate, the lower plate rotatably mounted on the rear wall of the chassis.

6. A retaining device for a PCI card, comprising:
 a chassis having a rear wall, the rear wall having two clipping portions and an perpendicular portion, a positioning slot formed in an inner side of the rear wall;
 a retaining plate configured for retaining the PCI card, the retaining plate comprising an end abutting on the perpendicular portion of the rear wall of the chassis; and
 a mounting apparatus comprising two arms extending respectively from two ends of one side thereof, the two arms engaging with the clipping portions of the rear wall of the chassis, the other side of the mounting apparatus being rotatably mounted on the rear wall, the mounting apparatus resisting against the end of the retaining plate to enable the end of the retaining plate to be sandwiched between the perpendicular portion of the rear wall and the mounting apparatus.

7. The retaining device as described in claim 6, wherein the mounting apparatus comprises a mounting strip and a mounting bracket, the mounting strip comprising an elongated main body and the two arms extending from two ends of the main body, the mounting strip abutting on one side of the mounting bracket, the other side of the mounting bracket rotatably mounted on the rear wall of the chassis.

8. The retaining device as described in claim 7, wherein the mounting bracket comprises an upper plate with two cutouts at two ends thereof for receiving the arms of the mounting strip, the main body of the mounting strip abutting on the upper plate of the mounting bracket.

9. The retaining device as described in claim 8, wherein each arm comprises a smaller portion extending from one end of the mounting strip and received in the corresponding cutout of the mounting bracket, and a larger portion extending from the smaller portion with a protrusion thereon for engaging with the corresponding clipping portion.

10. The retaining device as described in claim 9, wherein a width of the larger portion of the arm is larger than that of the cutout of the mounting bracket, and the main body of the mounting strip and the larger portions of the arms are placed on two opposite sides of the upper plate of the mounting bracket.

11. The retaining device as described in claim 10, wherein the mounting bracket comprises a connecting plate extending downward from one side of the upper plate, and a lower plate extending horizontally from the connecting plate, the lower plate rotatably mounted on the rear wall of the chassis.

12. The retaining device as described in claim 7, wherein the elongated main body is configured to be pulled outward to shorten the mounting strip to enable the two arms to disengage from the clipping portions.

13. The retaining device as described in claim 8, wherein the main body of the mounting strip comprises a handling portion formed in the middle portion thereof.

14. The retaining device as described in claim 13, wherein the upper plate of the mounting bracket comprises a second cutout formed in the middle portion thereof corresponding to the handling portion of the mounting strip.

15. The retaining device as described in claim 1, wherein the handling portion is configured to be pulled outward to shorten the mounting strip to enable the two arms to disengage from the clipping portions.

* * * * *